(12) United States Patent
Okamoto et al.

(10) Patent No.: US 11,671,119 B2
(45) Date of Patent: Jun. 6, 2023

(54) SIGNAL PROCESSING APPARATUS AND SIGNAL PROCESSING METHOD

(71) Applicant: NIPPON TELEGRAPH AND TELEPHONE CORPORATION, Tokyo (JP)

(72) Inventors: Seiji Okamoto, Tokyo (JP); Etsushi Yamazaki, Tokyo (JP); Masanori Nakamura, Tokyo (JP); Yoshiaki Kisaka, Tokyo (JP); Masahito Tomizawa, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/056,719

(22) PCT Filed: May 9, 2019

(86) PCT No.: PCT/JP2019/018608
§ 371 (c)(1),
(2) Date: Nov. 18, 2020

(87) PCT Pub. No.: WO2019/225343
PCT Pub. Date: Nov. 28, 2019

(65) Prior Publication Data
US 2021/0203363 A1    Jul. 1, 2021

(30) Foreign Application Priority Data

May 23, 2018   (JP) .............................. JP2018-099136

(51) Int. Cl.
*H03M 13/35*   (2006.01)
*H04L 1/00*    (2006.01)
(Continued)

(52) U.S. Cl.
CPC ........ *H03M 13/353* (2013.01); *H04L 1/0041* (2013.01); *H04L 1/203* (2013.01); *H04B 10/50* (2013.01)

(58) Field of Classification Search
CPC ..... H03M 13/353; H04L 1/203; H04L 1/0041
See application file for complete search history.

(56) References Cited

U.S. PATENT DOCUMENTS 4,536,742 A * 8/1985 Schouhamer Immink ...................
G11B 20/1426
341/67
6,504,493 B1 * 1/2003 Burd ..................... H03M 5/145
341/59

(Continued)

FOREIGN PATENT DOCUMENTS

EP      1352478 B1 * 11/2006 ............ H03M 13/23
JP    2004023691 A    1/2004
(Continued)

OTHER PUBLICATIONS

Y. Miyata et al., A Triple-Concatenated FEC using Soft-Decision Decoding for 100 GB/s Optical Transmission, OFC 2010, OThL3.
(Continued)

*Primary Examiner* — Cynthia Britt
*Assistant Examiner* — Dipakkumar B Gandhi
(74) *Attorney, Agent, or Firm* — Harness, Dickey & Pierce, P.L.C.

(57) ABSTRACT

A signal processing device includes a distributing unit and a plurality of correcting units with different processing performance, the distributing unit distributes a bit sequence having a first number of bits to the first correcting unit, and a bit sequence having a second number of bits less than the first number of bits to the second correcting unit having lower processing performance than the first correcting unit, the first correcting unit applies error correction processing to
(Continued)

the bit sequence having the first number of bits distributed to the first correcting unit, and the second correcting unit applies error correction processing to the bit sequence having the second number of bits distributed to the second correcting unit.

2 Claims, 11 Drawing Sheets

(51) Int. Cl.
  *H04L 1/20* (2006.01)
  *H03M 13/51* (2006.01)
  *H04B 10/50* (2013.01)

(56) References Cited

U.S. PATENT DOCUMENTS

| | | | | |
|---|---|---|---|---|
| 8,527,834 | B2* | 9/2013 | Nakao | H03M 13/05 714/758 |
| 8,621,316 | B2* | 12/2013 | Miyata | H03M 13/2945 714/755 |
| 8,990,655 | B2* | 3/2015 | Kwok | H03M 13/1575 714/758 |
| 2008/0148127 | A1* | 6/2008 | Miyata | H04L 1/0064 714/755 |
| 2010/0008497 | A1* | 1/2010 | Takatsu | H04L 9/002 380/42 |
| 2016/0329915 | A1 | 11/2016 | Luo et al. | |
| 2020/0028767 | A1 | 1/2020 | Yoshida et al. | |

FOREIGN PATENT DOCUMENTS

| | | |
|---|---|---|
| JP | 4382124 B2 | 12/2009 |
| JP | 2016115973 A | 6/2016 |
| JP | 6308314 B1 | 4/2018 |

OTHER PUBLICATIONS

T. Yoshida et al., Performance Metrics for Systems with Soft-Decision FEC and Probabilistic Shaping, IEEE Photonic's Technology Letters, vol. 29, issue 23, 2017.

Huawei, HiSilicon, Signal shaping for QAM constellations, online, 3GPP TSG RAN WG1 Meeting # 88bis, R1-1705061, 2017.

* cited by examiner

SIGNAL PROCESSING APPARATUS AND SIGNAL PROCESSING METHOD

CROSS-REFERENCE TO RELATED APPLICATIONS

This application is a 371 National Stage of International Application No. PCT/JP2019/018608 filed on May 9, 2019, which claims priority to Japanese Patent Application No. 2018-099136, filed May 23, 2018. The entire disclosures of the above applications are incorporated herein by reference.

TECHNICAL FIELD

The present invention relates to a signal processing device and a signal processing method.

BACKGROUND ART

A signal processing device (A signal processing apparatus) of a communication system may encode a transmission signal by probabilistic shaping (PS) or the like. The signal processing device applies forward error correction (FEC) processing to the encoded transmission signal (see Non Patent Literature 1). An optical transmitter including the signal processing device generates an optical signal representing the transmission signal subjected to the error correction processing, and transmits the generated optical signal to an optical receiver.

A throughput (transmission rate) of the encoded transmission signal may be higher than a throughput of the encoded transmission signal. In this case, a forward error correcting unit is required to perform the error correction processing of the transmission signal at a high throughput of the encoded transmission signal.

Also, when the transmission signal is encoded by probabilistic shaping, the signal processing device may change the throughput of the encoded transmission signal. In this case, the forward error correcting unit is required to perform the error correction processing of the transmission signal at the changed throughput.

FIG. 12 is a diagram illustrating an exemplary configuration of a related art signal processing device. The signal processing device 100 includes an encoding unit 110. The encoding unit 110 acquires, for example, a 400 Gbps transmission signal, and encodes the acquired transmission signal by probabilistic shaping. The encoding unit 110 outputs the transmission signal encoded by probabilistic shaping, for example, at a throughput of 600 Gbps.

The signal processing device 100 includes, as a plurality of forward error correcting units, a correcting unit 120, a correcting unit 130, and a correcting unit 140. The correcting unit 120 can perform the error correction processing of the transmission signal at a throughput of 600 Gbps or less. The correcting unit 130 can perform the error correction processing of the transmission signal at a throughput of 400 Gbps or less. The correcting unit 140 can perform the error correction processing of the transmission signal at a throughput of 200 Gbps or less.

The correcting unit 120, the correcting unit 130, and the correcting unit 140 cannot flexibly change the throughput of the error correction processing. For this reason, the encoding unit 110 selects the correcting unit 120 that can perform the error correction processing of the transmission signal at the throughput of 600 Gbps or less as an output destination of the 600 Gbps transmission signal. The encoding unit 110 outputs the 600 Gbps transmission signal to the selected correcting unit 120. The correcting unit 120 performs the error correction processing of the transmission signal at a throughput of 600 Gbps. The correcting unit 130 and the correcting unit 140 are not selected and thus, are not used.

CITATION LIST

Non Patent Literature

NPL 1: Yoshikuni Miyata, Kenya Sugihara, Wataru Matsumoto, et al., "A Triple-Concatenated FEC using Soft-Decision Decoding for 100 Gb/s Optical Transmission", OFC 2010 OThL3

SUMMARY OF THE INVENTION

Technical Problem

As such, the related art signal processing device needs to include the forward error correcting unit that can perform the error correction processing of the transmission signal at a high throughput, for each throughput of the error correction processing. Therefore, the related art signal processing device has the problem that the efficiency of the transmission cannot be improved unless the circuit size is increased.

In light of the foregoing, an object of the present invention is to provide a signal processing device and a signal processing method that can improve the efficiency of transmission without increasing the circuit size.

Means for Solving the Problem

An aspect of the present invention is a signal processing device including: a distributing unit; and a plurality of correcting units with different processing performance, wherein the distributing unit is configured to distribute a bit sequence having a first number of bits to a first correcting unit of the correcting units, and a bit sequence having a second number of bits less than the first number of bits to a second correcting unit of the correcting units having lower processing performance than the first correcting unit, the first correcting unit is configured to apply error correction processing to the bit sequence having the first number of bits distributed to the first correcting unit, and the second correcting unit is configured to apply error correction processing to the bit sequence having the second number of bits distributed to the second correcting unit.

An aspect of the present invention is the above-described signal processing device, further including a control unit configured to set an operating frequency of the first correcting unit to be higher than an operating frequency of the second correcting unit.

One aspect of the present invention is the above-described signal processing device, further including an output unit configured to output an encoded bit sequence to the distributing unit, wherein the distributing unit distributes the encoded bit sequence to the plurality of correcting units according to a characteristic of error rate at each bit position of the encoded bit sequence.

One aspect of the present invention is a signal processing method implemented by a signal processing device including a distributing unit and a plurality of correcting units with different processing performance, the method including: at the distributing unit, distributing a bit sequence having a first number of bits to a first correcting unit of the error correcting units, and a bit sequence having a second number of bits less than the first number of bits to a second correcting unit of the error correcting units having lower processing performance than the first correcting unit, at the first correcting unit, applying error correction processing to the bit sequence having the first number of bits distributed to the first correcting unit, and at the second correcting unit, applying error correction processing to the bit sequence having the second number of bits distributed to the second correcting unit.

Effects of the Invention

According to the present invention, the efficiency of transmission can be improved without increasing the circuit size.

DESCRIPTION OF EMBODIMENTS

Embodiments of the present invention will be described in detail with reference to the drawings.

First Embodiment

Figure 1:
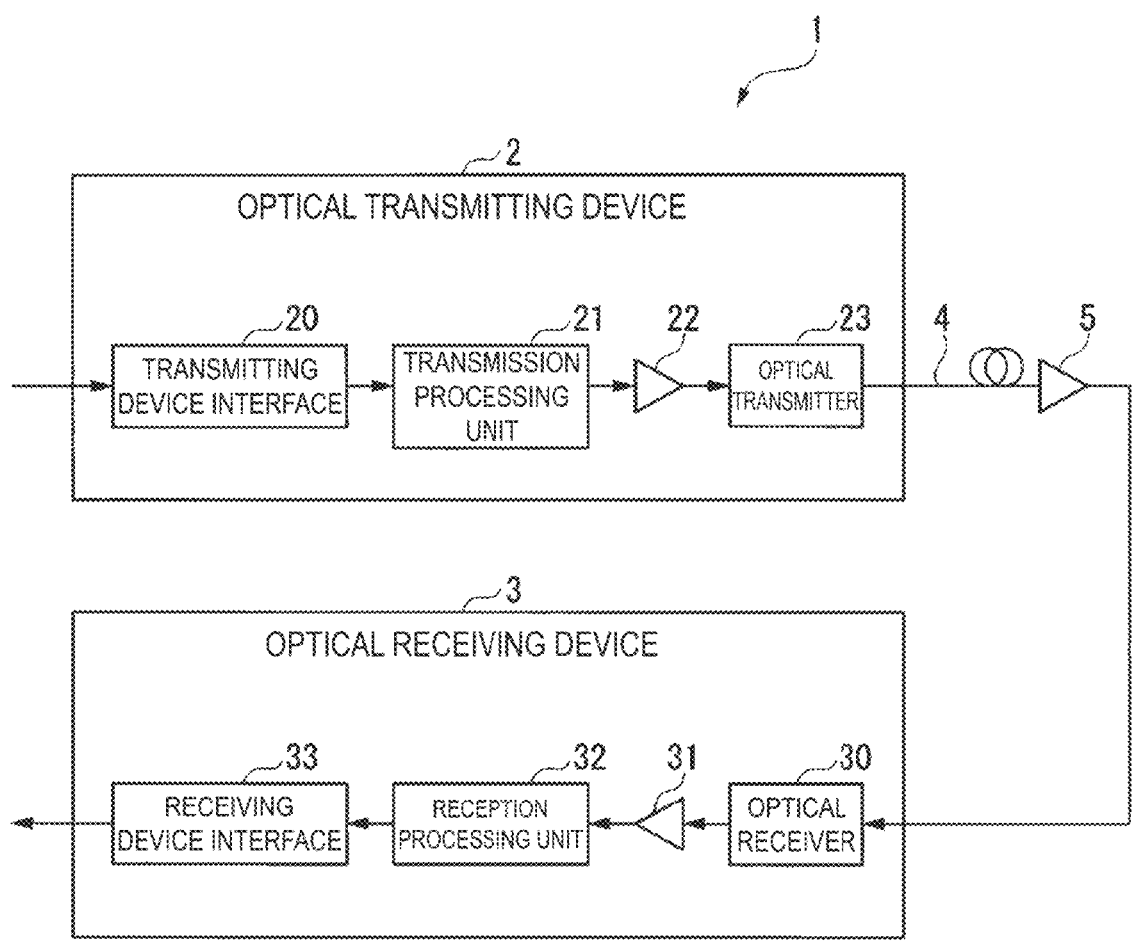
FIG. 1 is a diagram illustrating an exemplary configuration of a communication system according to a first embodiment.

FIG. 1 is a diagram illustrating an exemplary configuration of a communication system 1. The optical communication system 1 includes an optical transmitting device 2 and an optical receiving device 3. The communication system 1 includes an optical fiber 4 and an amplifying unit 5 in a transmission line. The optical transmitting device 2 and the optical receiving device 3 communicate with each other by an optical signal via the transmission line.

The optical transmitting device 2 and the optical receiving device 3 may store computer software programs in non-volatile storage (non-transitory recording media) such as a flash memory. At least some of the functions of the optical transmitting device 2 and the optical receiving device 3 may be implemented by a computer software program.

The optical transmitting device 2 includes a transmitting device interface 20, a transmission processing unit 21, a driver 22, and an optical transmitter 23. The transmitting device interface 20 acquires a bit sequence from a client device (not illustrated). The transmission processing unit 21 encodes the acquired bit sequence.

The driver 22 drives the optical transmitter 23 according to the encoded bit sequence. The optical transmitter 23 generates an optical signal in response to driving by the driver 22. The optical transmitter 23 transmits the generated optical signal to the optical receiving device 3 via the transmission line.

The optical receiving device 3 includes an optical receiver 30, an amplifier 31, a reception processing unit 32, and a receiving device interface 33. The optical receiver 30 receives an optical signal from the optical transmitting device 2. The amplifier 31 converts the received optical signal into an analog reception signal. The reception processing unit 32 converts the analog reception signal into a digital reception signal. The reception processing unit 32 decodes the bit sequence based on the digital reception signal. The receiving device interface 33 sends the decoded bit sequence to a client device (not illustrated).

The optical fiber 4 transmits an optical signal. The amplifying unit 5 amplifies the optical intensity of the transmitted optical signal in the transmission line.

Figure 2:
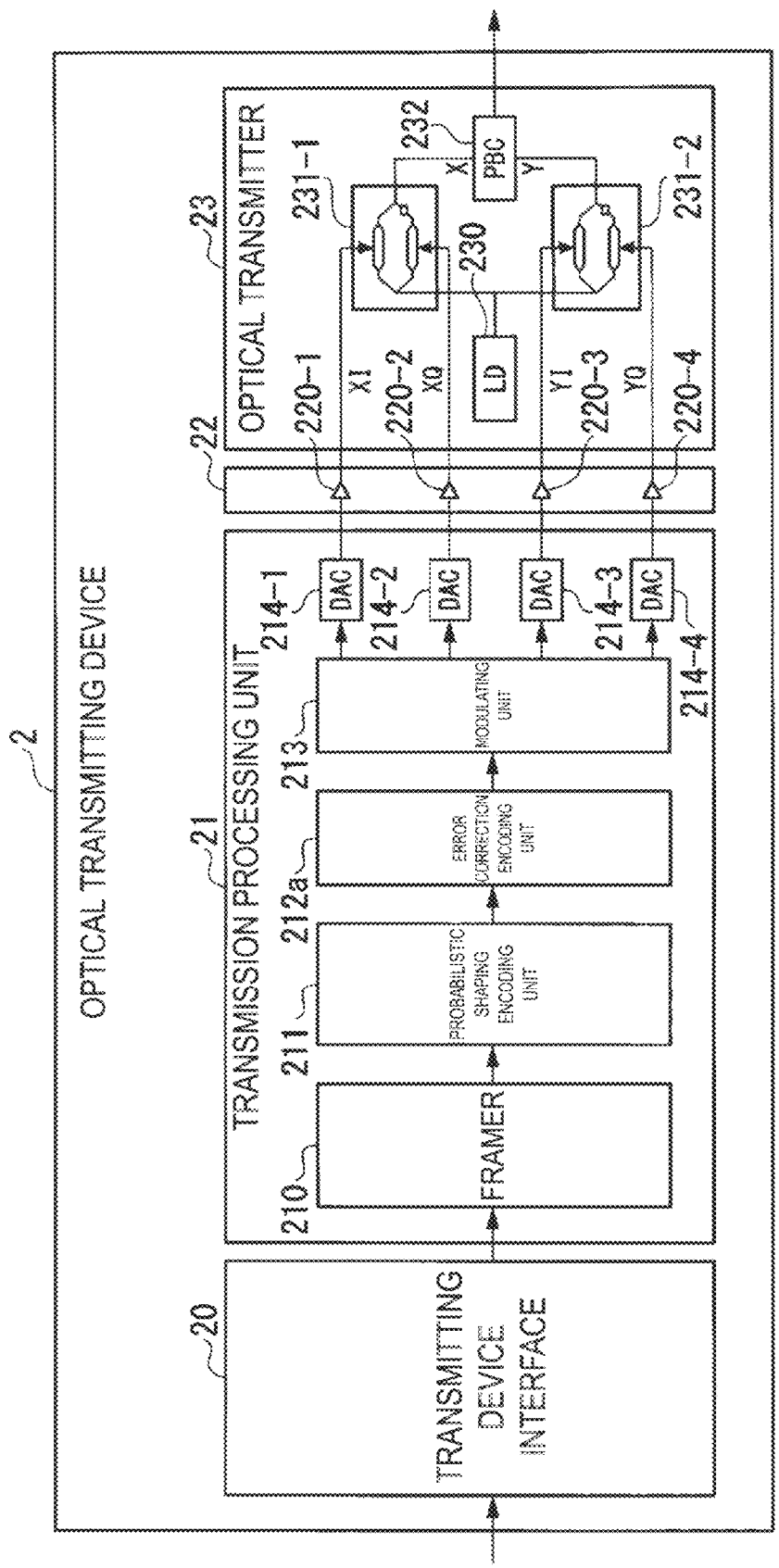
FIG. 2 is a diagram illustrating an exemplary configuration of an optical transmitting device according to the first embodiment.

Next, an exemplary configuration of each of the optical transmitting device 2 and the optical receiving device 3 will be described. FIG. 2 is a diagram illustrating the exemplary configuration of the optical transmitting device 2. The transmission processing unit 21 includes a framer 210, a probabilistic shaping encoding unit 211, an error correction encoding unit 212a, a modulating unit 213, and a digital-to-analog converting unit 214.

Note that the transmission processing unit 21 does not necessarily include the probabilistic shaping encoding unit 211. For example, the transmission processing unit 21 may include, instead of the probabilistic shaping encoding unit 211, a functional unit that outputs a bit sequence at a higher throughput than a throughput of a bit sequence acquired from an external device by the optical transmitting device 2, as an output unit of a bit sequence. That is, the transmission processing unit 21 may include a functional unit that outputs a bit sequence at a higher throughput than the related art method.

The framer 210 acquires a bit sequence from the transmitting device interface 20. The framer 210 converts the acquired bit sequence into a bit sequence of predetermined format (frame).

The probabilistic shaping encoding unit 211 acquires the bit sequence of predetermined format from the framer 210 and encodes the acquired bit sequence. The probabilistic shaping encoding unit 211 encodes the bit sequence by, for example, probabilistic shaping. The throughput of the bit sequence encoded by the probabilistic shaping encoding unit 211 is higher than the throughput of the bit sequence acquired by the framer 210 from the transmitting device interface 20. The probabilistic shaping encoding unit 211 outputs the encoded bit sequence to the error correction encoding unit 212a. The error correction encoding unit 212a corrects an error that has occurred in the encoded bit sequence. The modulating unit 213 applies modulation processing to the bit sequence for which the error has been corrected.

The digital-to-analog converting unit 214-1 acquires an XI signal that is an in-phase (In-phase) signal of a first polarization component X among the first polarization component X and a second polarization component Y that are orthogonal to each other, from the modulating unit 213. The digital-to-analog converting unit 214-1 converts the digital XI signal into an analog XI signal, and outputs the analog XI signal to the driver 22.

The digital-to-analog converting unit 214-2 acquires an XQ signal that is an orthogonal phase (Quadrature) signal of the first polarization component X, from the modulating unit 213. The digital-to-analog converting unit 214-2 converts the digital XQ signal into an analog XQ signal and outputs the analog XQ signal to the driver 22.

The digital-to-analog converting unit 214-3 acquires the YI signal that is an in-phase signal of the second polarization component Y from the modulating unit 213. The digital-to-analog converting unit 214-3 converts the digital YI signal into an analog YI signal, and outputs the analog a YI signal to the driver 22.

The digital-to-analog converting unit 214-4 acquires a YQ signal that is an orthogonal phase signal of the second polarization component Y, from the modulating unit 213. The digital-to-analog converting unit 214-4 converts the digital YQ signal into an analog YQ signal and outputs the analog YQ signal to the driver 22.

The driver 22 comprises modulator drivers 220-1 to 220-4. The modulator drivers 220-1 to 220-4 drive a polarization modulator of the optical transmitter 23. The modulator driver 220-1 outputs the analog XI signal to the optical transmitter 23. The modulator driver 220-2 outputs the analog XQ signal to the optical transmitter 23. The modulator driver 220-3 outputs the analog YI signal to the optical transmitter 23. The modulator driver 220-4 outputs the analog YQ signal to the optical transmitter 23.

The optical transmitter 23 includes a signal light source 230, polarization modulators 231, and a polarization beam combiner (PBC) 232. The signal light source 230 is a laser diode that outputs laser light. The signal light source 230 outputs laser light to the polarization modulators 231-1 and 231-2.

The polarization modulator 231-1 modulates the laser light in response to the XI and XQ signals to generate an optical signal of the first polarization component X. The polarization modulator 231-1 outputs the generated optical signal of the first polarization component X to the polarization beam combiner 232.

The polarization modulator 231-2 modulates the laser light in response to the YI and YQ signals to generate an optical signal of the second polarization component Y. The polarization modulator 231-2 outputs the generated optical signal of the second polarization component Y to the polarization beam combiner 232.

The polarization beam combiner 232 mixes the optical signal of the first polarization component Y and the optical signal of the second polarization component Y. The polarization beam combiner 232 transmits the combined optical signal to the optical receiving device 3 via the transmission line.

Figure 3:
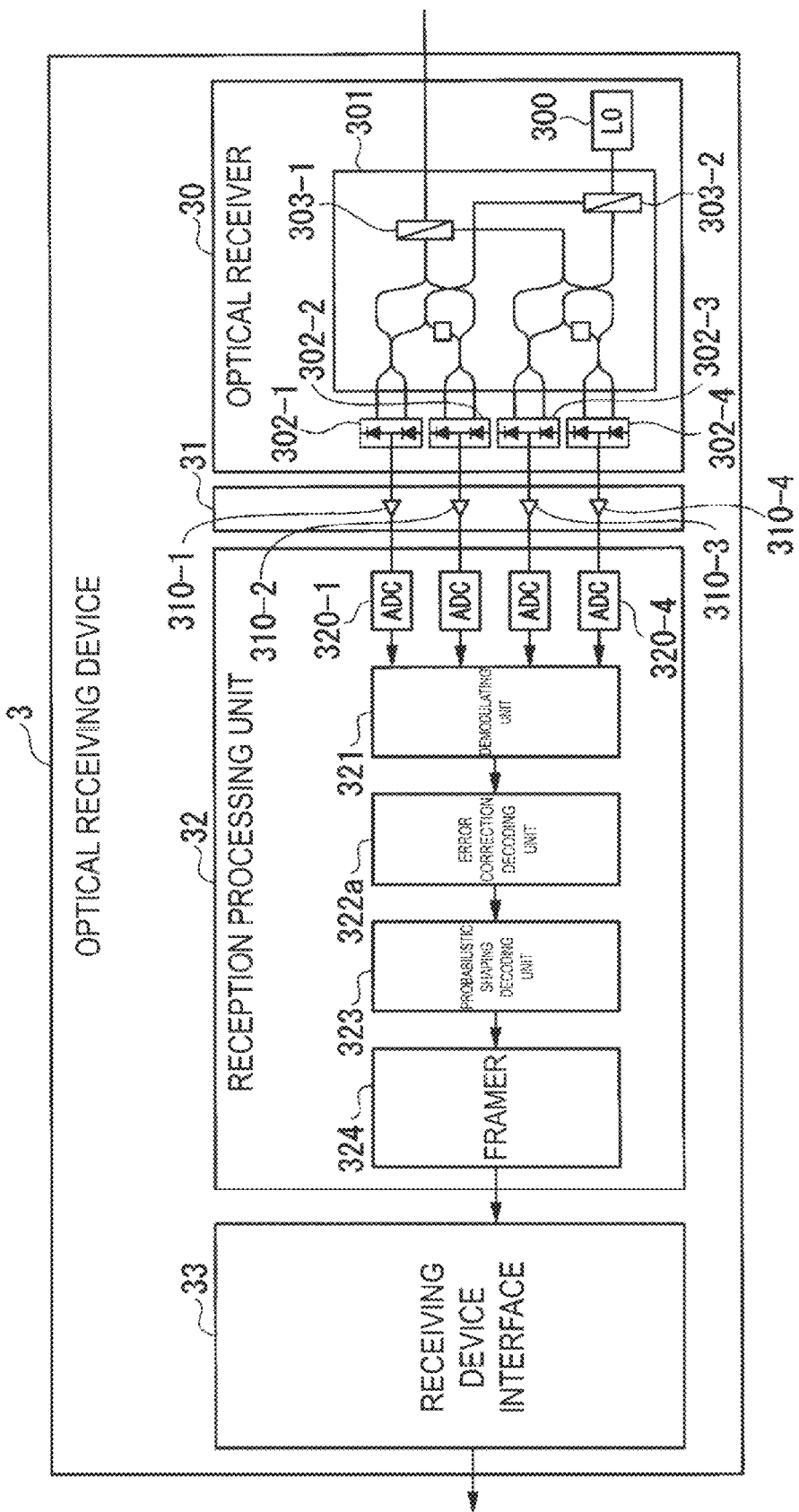
FIG. 3 is a diagram illustrating an exemplary configuration of an optical receiving device according to the first embodiment.

FIG. 3 is a diagram illustrating an exemplary configuration of the optical receiving device 3. The optical receiver 30 comprises a local light source (local oscillator) 300, a 90-degree optical hybrid 301 (90° optical hybrid), and balanced optical detectors 302-1 to 302-4. The local light source 300 outputs laser light as local light to the 90-degree optical hybrid 301.

The 90-degree optical hybrid 301 is a function unit that mixes the received optical signal and local light to detect the in-phase signal and the orthogonal phase signal. The 90-degree optical hybrid 301 includes a polarizing beam splitter 303. The polarizing beam splitter 303 separates the polarization component of the light output from the local light source 300.

The balanced optical detectors 302 detect interference light in the light output from the 90-degree optical hybrid 301 for each polarization component. Here, the balanced optical detector 302-1 outputs a current signal representing the XI signal in the interference light to the amplifier 31. The balanced optical detector 302-2 outputs a current signal representing the XQ signal in the interference light to the amplifier 31. The balanced optical detector 302-3 outputs a current signal representing the YI signal in the interference light to the amplifier 31. The balanced optical detector 302-4 outputs a current signal representing the YQ signal in the interference light to the amplifier 31.

The amplifier 31 includes trans-impedance amplifiers 310-1 to 310-4.

The trans-impedance amplifier 310-1 applies impedance conversion to the current signal representing the XI signal, thereby outputting the XI signal that is the analog signal (voltage signal) to the reception processing unit 32. Similarly, the trans-impedance amplifier 310-2 outputs the XQ signal that is the analog signal (voltage signal) to the reception processing unit 32. Similarly, the trans-impedance amplifier 310-3 outputs the YI signal that is the analog signal (voltage signal) to the reception processing unit 32. Similarly, the trans-impedance amplifier 310-4 outputs the YQ signal that is the analog signal (voltage signal) to the reception processing unit 32.

The reception processing unit 32 includes analog-to-digital converting units 320-1 to 320-4, a demodulating unit 321, an error correction decoding unit 322a, a probabilistic shaping decoding unit 323, and a framer 324. The analog-to-digital converting unit 320-1 converts the analog XI signal into a digital XI signal. The analog-to-digital converting unit 320-2 converts the analog XQ signal into a digital XQ signal. The analog-to-digital converting unit 320-3 converts the analog YI signal into a digital YI signal. The analog-to-digital converting unit 320-4 converts the analog YQ signal into a digital YQ signal.

The demodulating unit 321 demodulates the digital XI signal, XQ signal, YI signal, and YQ signal. The error correction decoding unit 322a corrects an error in the demodulated bit sequence. The probabilistic shaping decoding unit 323 applies decoding processing to the bit sequence for which the error has been corrected. The framer 324 converts the decoded bit sequence into a bit sequence of predetermined format (frame). The framer 210 outputs the bit sequence of predetermined format to the receiving device interface 33.

Next, an exemplary configuration of the error correction encoding unit 212a and the error correction decoding unit 322a will be described.

Figure 4:
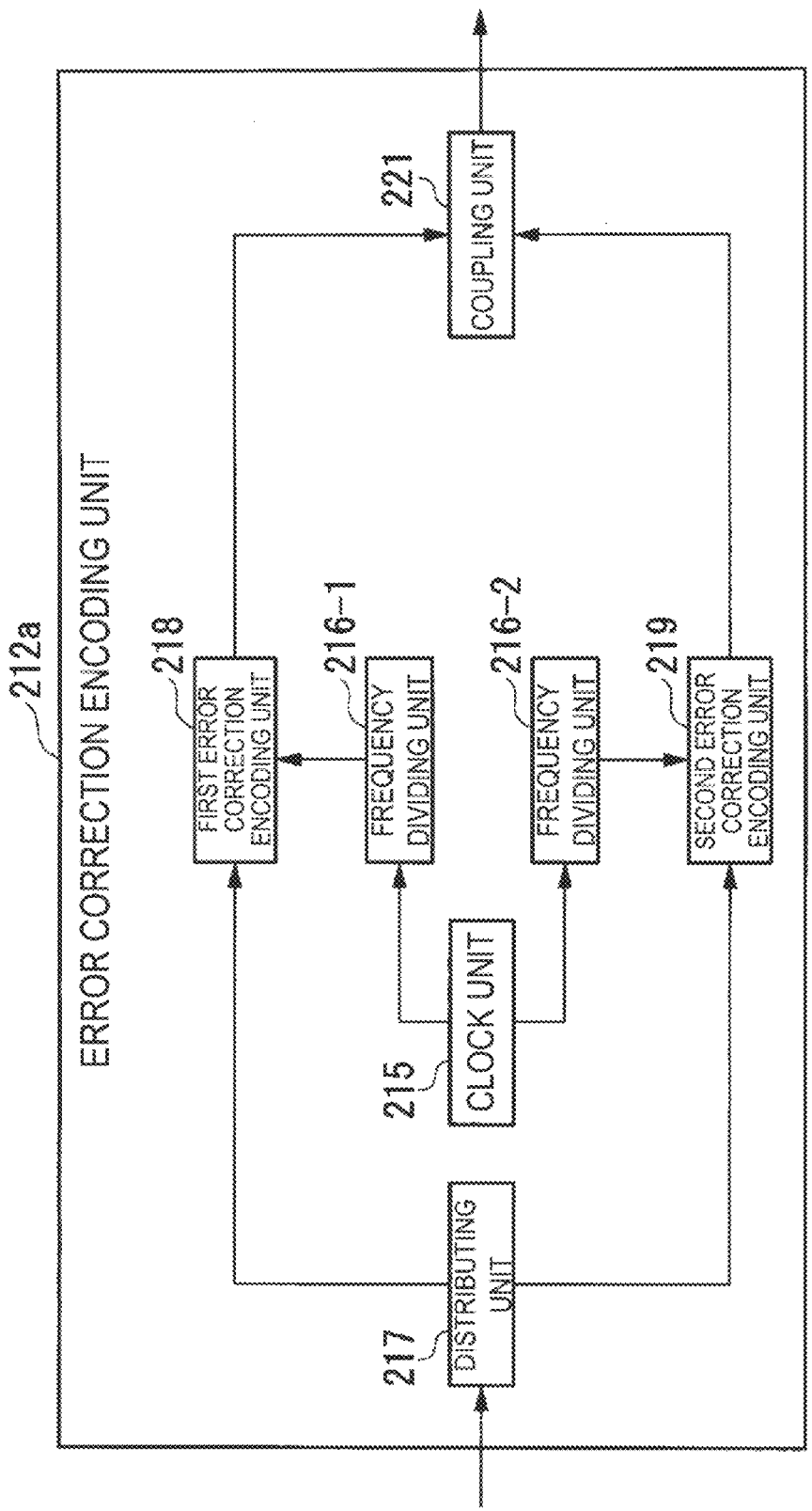
FIG. 4 is a diagram illustrating an exemplary configuration of an error correction encoding unit according to the first embodiment.

FIG. 4 is a diagram illustrating the exemplary configuration of the error correction encoding unit 212a. The error correction encoding unit 212a includes a clock unit 215, a frequency dividing unit 216-1, a frequency dividing unit 216-2, a distributing unit 217, a first error correction encoding unit 218, a second error correction encoding unit 219, and a coupling unit 221. The error correction encoding unit 212a may further include a frequency dividing unit 216, and a correcting unit such as the first error correction encoding unit 218.

The performance (characteristic) for error correction is expressed using net coding gain (NCG).

The coding gain of the first error correction encoding unit 218 is higher than the coding gain of the second error correction encoding unit 219, for example, 11.8. The coding gain of the second error correction encoding unit 219 is 11.3, for example. The clock unit 215 outputs a clock signal of a predetermined frequency to each of the frequency dividing units 216.

The frequency dividing unit 216-1 acquires the clock signal output from the clock unit 215. The frequency dividing unit 216-1 divides the clock signal acquired from the clock unit 215 by the frequency dividing unit 216-1 at a frequency division ratio that is smaller than a frequency division ratio at which the frequency dividing unit 216-2 divides the clock signal. The frequency dividing unit 216-1 outputs the clock signal divided by the frequency dividing unit 216-1 to the first error correction encoding unit 218. As a result, according to the number of bits in the bit sequence allocated to each of the correcting units, the frequency dividing unit 216-1 sets the operating frequency of the first error correction encoding unit 218 having higher coding gain to be higher than the operating frequency of the second error correction encoding unit 219 having low coding gain.

The frequency dividing unit 216-2 acquires the clock signal output from the clock unit 215. The frequency dividing unit 216-2 divides the clock signal acquired from the clock unit 215 by the frequency dividing unit 216-2 at a frequency division ratio that is larger than the frequency division ratio at which the frequency dividing unit 216-1 divides the clock signal. The frequency dividing unit 216-2 outputs the clock signal divided by the frequency dividing unit 216-2 to the second error correction encoding unit 219. As a result, according to the number of bits in the bit sequence allocated to each of the correcting units, the frequency dividing unit 216-2 sets the operating frequency of the second error correction encoding unit 219 having low coding gain to be lower than the operating frequency of the first error correction encoding unit 218 having high coding gain.

Also in the case where the error correction encoding unit 212a further includes the frequency dividing unit 216, the frequency dividing unit 216 sets the operating frequency of the correcting unit having high coding gain to be higher than the operating frequency of the correcting unit having low coding gain. As a result, according to the large number of bits in the bit sequence distributed to the correcting unit having high coding gain, the frequency dividing unit 216 sets the operating frequency of the correcting unit having high coding gain to be higher than the operating frequency of the correcting unit having low coding gain.

The distributing unit 217 distributes the bit sequence acquired from the probabilistic shaping encoding unit 211 to the first error correction encoding unit 218 and the second error correction encoding unit 219 according to the number of bits in the bit sequence. For encoding of the bit sequence, the distributing unit 217 preferentially uses the correcting unit (correction encoding unit) that does not decrease in processing performance for error correction among the first error correction encoding unit 218 and the second error correction encoding unit 219. That is, the error correction encoding unit 212a distributes a bit sequence having a large number of bits to the correcting unit (correction encoding unit) with relatively high processing performance for error correction.

As a result, the distributing unit 217 may efficiently use the first error correction encoding unit 218 and the second error correction encoding unit 219 to improve the characteristic of encoding of the transmission signal. The elements of the first error correction encoding unit 218 and the second error correction encoding unit 219 may have the identical performance, for example, the processing performance of the second error correction encoding unit 219 may be set to be intentionally low by internal processing of the second error correction encoding unit 219.

The first error correction encoding unit 218 performs error correction processing of the bit sequence distributed to the first error correction encoding unit 218 at the operating frequency determined by the clock signal output from the frequency dividing unit 216-1. The first error correction encoding unit 218 is an encoding unit that performs error correction processing, which is not limited to a particular error correction, for example, a forward error correcting unit. The first error correction encoding unit 218 adds redundant bits to the bit sequence distributed to the first error correction encoding unit 218.

The second error correction encoding unit 219 performs error correction processing of the bit sequence distributed to the second error correction encoding unit 219 at the operating frequency determined by the clock signal output from the frequency dividing unit 216-2. The second error correction encoding unit 219 is an encoding unit that performs error correction processing, which is not limited to a particular error correction, for example, a forward error correcting unit. The second error correction encoding unit 219 adds redundant bits to the bit sequence distributed to the second error correction encoding unit 219.

Also in the case where the error correction encoding unit 212a further includes a correcting unit, the correcting unit applies the error correction processing to the bit sequence distributed to the correcting unit at the operating frequency determined by the clock signal output from the frequency dividing unit 216.

The coupling unit 221 acquires the bit sequence subjected to the error correction processing from the first error correction encoding unit 218. The coupling unit 221 acquires the bit sequence subjected to the error correction processing from the second error correction encoding unit 219. The number of bits in the bit sequence acquired from the first error correction encoding unit 218 is larger than the number of bits in the bit sequence acquired from the second error correction encoding unit 219. The coupling unit 221 couples the bit sequences subjected to the error correction processing. The coupling unit 221 outputs a bit sequence, which is a result of the coupling, to the modulating unit 213.

Figure 5:
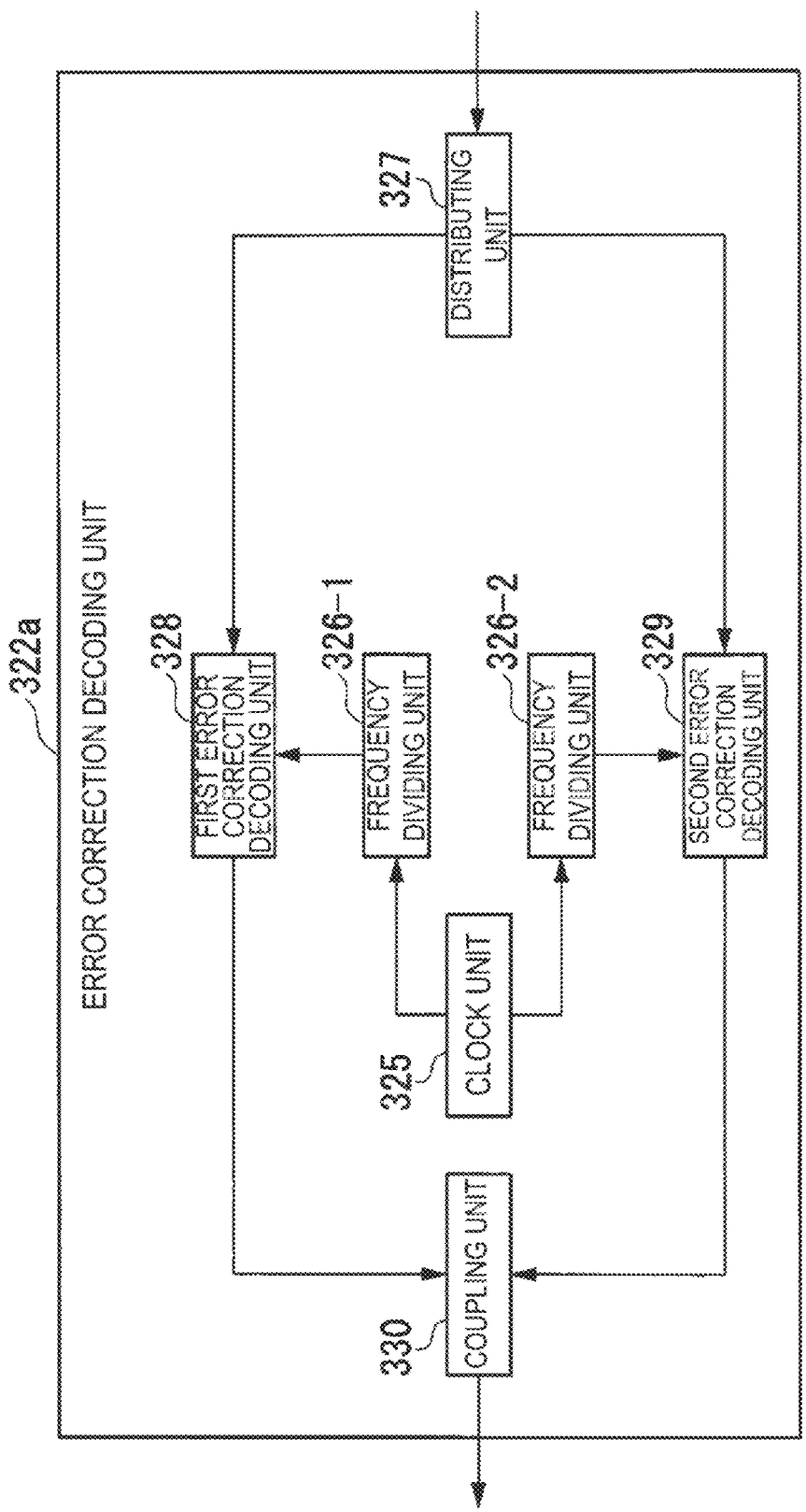
FIG. 5 is a diagram illustrating an exemplary configuration of an error correction decoding unit according to the first embodiment.

FIG. 5 is a diagram illustrating an exemplary configuration of the error correction decoding unit 322a. The error correction decoding unit 322a includes a clock unit 325, a frequency dividing unit 326-1, a frequency dividing unit 326-2, a distributing unit 327, a first error correction decoding unit 328, a second error correction decoding unit 329, and a coupling unit 330.

The error correction decoding unit 322a may further include a frequency dividing unit 326 and a correcting unit such as the first error correction decoding unit 328.

The coding gain of the first error correction decoding unit 328 is higher than the coding gain of the second error correction decoding unit 329, for example, 11.8. The coding gain of the second error correction decoding unit 329 is 11.3, for example. The clock unit 325 outputs a clock signal of a predetermined frequency to each of the frequency dividing units 326.

The frequency dividing unit 326-1 acquires the clock signal output from the clock unit 325. The frequency dividing unit 326-1 divides the clock signal acquired from the clock unit 325 by the frequency dividing unit 326-1 at a frequency division ratio that is smaller than a frequency division ratio at which the frequency dividing unit 326-2 divides the clock signal. The frequency dividing unit 326-1 outputs a clock signal divided by the frequency dividing unit 326-1 to the first error correction decoding unit 328. As a result, according to the number of bits in the bit sequence allocated to each of the correcting units, the frequency dividing unit 326-1 sets the operating frequency of the first error correction decoding unit 328 having high coding gain to be higher than the operating frequency of the second error correction decoding unit 329 having low coding gain.

The frequency dividing unit 326-2 acquires the clock signal output from the clock unit 325. The frequency dividing unit 326-2 divides the clock signal acquired from the clock unit 325 by the frequency dividing unit 326-2 at a frequency division ratio that is larger than the frequency division ratio at which the frequency dividing unit 326-1 divides the clock signal. The frequency dividing unit 326-2 outputs the clock signal divided by the frequency dividing unit 326-2 to the second error correction decoding unit 329. As a result, according to the number of bits in the bit sequence allocated to each of the correcting units, the frequency dividing unit 326-2 sets the operating frequency of the second error correction decoding unit 329 having low coding gain to be lower than the operating frequency of the first error correction decoding unit 328 having high coding gain.

The distributing unit 327 distributes the bit sequence acquired from the demodulating unit 321 to the first error correction decoding unit 328 and the second error correction decoding unit 329 according to the number of bits in the bit sequence. The distributing unit 327 preferentially uses the correcting unit with higher performance for error correction among the first error correction decoding unit 328 and the second error correction decoding unit 329, to correct an error in the bit sequence. That is, the error correction decoding unit 322a distributes the bit sequence having a large number of bits to the correcting unit with relatively high processing performance for error correction. Accordingly, the distributing unit 327 may efficiently use the first error correction decoding unit 328 and the second error correction decoding unit 329 to improve the characteristic of error correction of the reception signal.

The first error correction decoding unit 328 corrects an error in the bit sequence distributed to the first error correction decoding unit 328 at an operating frequency determined by the clock signal output from the frequency dividing unit 326-1. The first error correction decoding unit 328 is, for example, a forward error correcting unit. The first error correction decoding unit 328 corrects an error in the bit sequence distributed to the first error correction decoding unit 328 based on redundant bits added to the bit sequence.

The second error correction decoding unit 329 corrects an error in the bit sequence distributed to the second error correction decoding unit 329 at an operating frequency determined by the clock signal output from the frequency dividing unit 326-2. The second error correction decoding unit 329 is, for example, a forward error correcting unit. The second error correction decoding unit 329 corrects an error in the bit sequence distributed to the second error correction decoding unit 329 based on redundant bits added to the bit sequence.

In the case where the error correction decoding unit 322a further includes a correcting unit, the correcting unit corrects an error in the bit sequence distributed to the correcting unit at the operating frequency determined by the clock signal output from the frequency dividing unit 216.

The coupling unit 330 acquires the bit sequence for which the error has been corrected, from the first error correction decoding unit 328. The coupling unit 330 acquires the bit sequence for which the error has been corrected, from the second error correction decoding unit 329. The number of bits in the bit sequence acquired from the first error correction decoding unit 328 is larger than the number of bits in the bit sequence acquired from the second error correction decoding unit 329. The coupling unit 330 couples the bit sequences for which the error has been corrected. The coupling unit 330 outputs a bit sequence, which is a result of the coupling, to the probabilistic shaping decoding unit 323.

Next, examples of operations of the transmission processing unit 21 and the reception processing unit 32 will be described.

Figure 6:
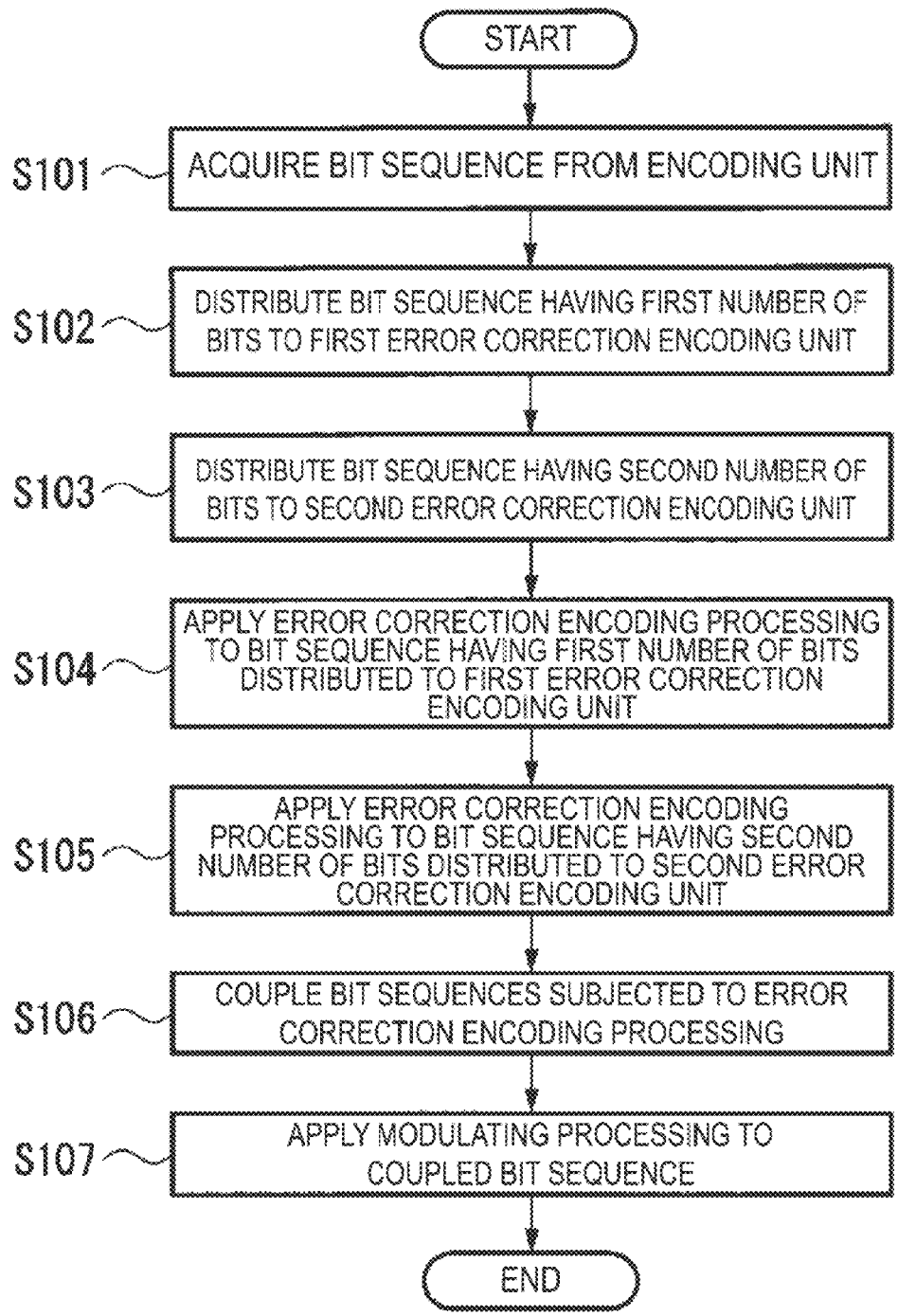
FIG. 6 is a flowchart illustrating exemplary operations performed by a transmission processing unit according to the first embodiment.

FIG. 6 is a flowchart illustrating exemplary operations of the transmission processing unit 21. The distributing unit 217 acquires the encoded bit sequence from the probabilistic shaping encoding unit 211 (step S101).

The distributing unit 217 distributes a bit sequence having a first number of bits to the first error correction encoding unit 218 (step S102). The distributing unit 217 distributes a bit sequence having a second number of bits less than the first number of bits to the second error correction encoding unit 219 that is lower than the first error correction encoding unit 218 in processing performance (step S103). The first error correction encoding unit 218 applies the error correction encoding processing to the bit sequence having the first number of bits distributed to the first error correction encoding unit 218 (step S104). The second error correction encoding unit 219 applies the error correction encoding processing to the bit sequence having the second number of bits distributed to the second error correction encoding unit 219 (step S105). The coupling unit 221 couples the bit sequences subjected to the error correction encoding processing (step S106). The modulating unit 213 applies modulation processing to the coupled bit sequence (step S107).

Figure 7:
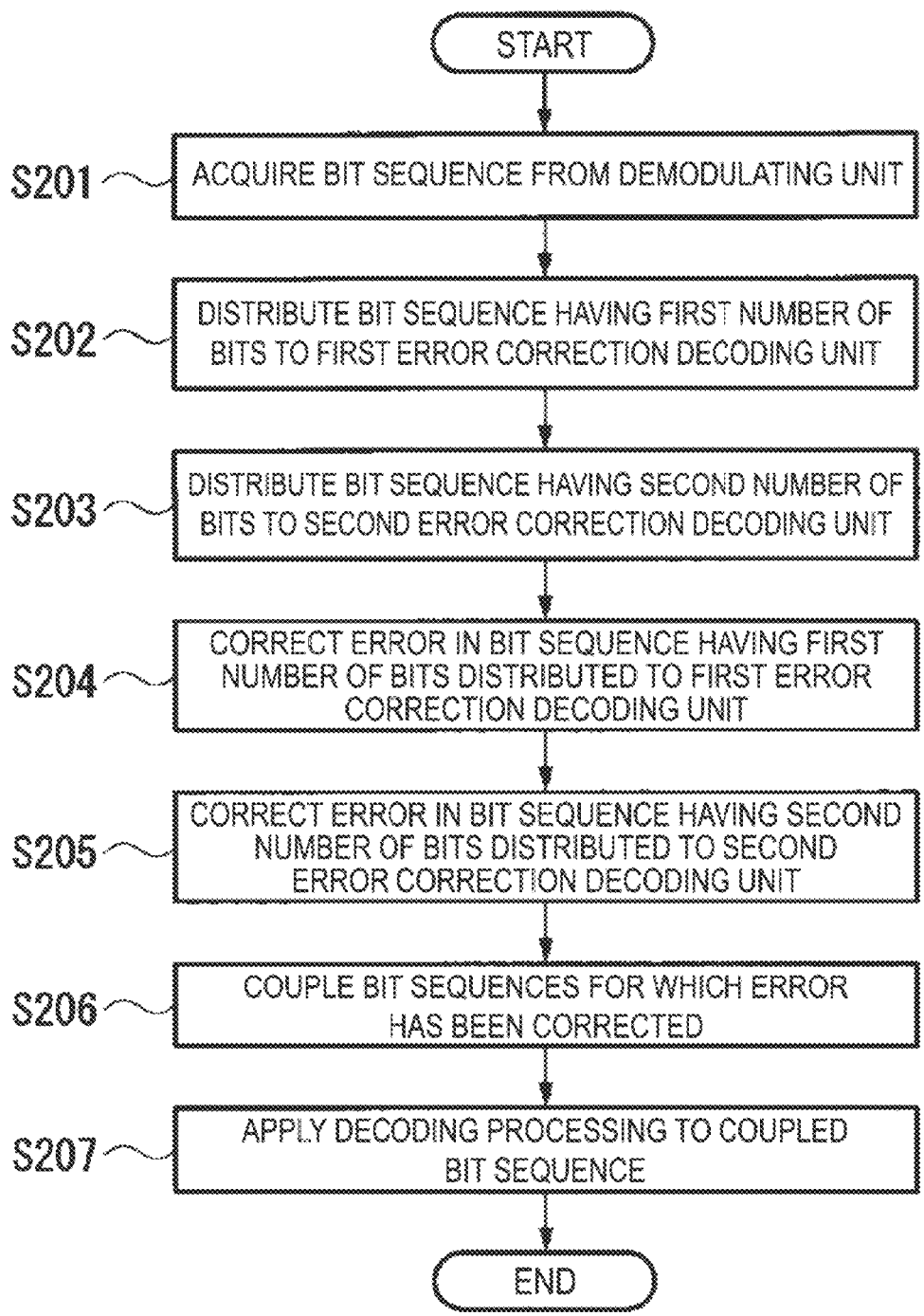
FIG. 7 is a flowchart illustrating exemplary operations performed by a reception processing unit according to the first embodiment.

FIG. 7 is a flowchart illustrating exemplary operations of the reception processing unit 32. The distributing unit 327 acquires the encoded bit sequence from the demodulating unit 321 (step S201). The distributing unit 327 distributes the bit sequence having the first number of bits to the first error correction decoding unit 328 with high performance for error correction (step S202). The distributing unit 327 distributes the bit sequence having the second number of bits less than the first number of bits to the second error correction decoding unit 329 with low performance for error correction (step S203). The first error correction decoding unit 328 corrects an error in the bit sequence having the first number of bits distributed to the first error correction decoding unit 328 (step S204). The second error correction decoding unit 329 corrects an error in the bit sequence having the second number of bits distributed to the second error correction decoding unit 329 (step S205). The coupling unit 330 couples the bit sequences for which the error has been corrected (step S206). The probabilistic shaping decoding unit 323 applies decoding processing to the coupled bit sequence (step S207).

As described above, the error correction encoding unit 212a of the first embodiment (the signal processing device (the signal processing apparatus) of the optical transmitting device 2) includes the distributing unit 217 (distributor) and the plurality of correcting units with different processing performances for error correction. The distributing unit 217 distributes the bit sequence having the first number of bits to the first error correction encoding unit 218 (first correcting unit, first corrector). The distributing unit 217 distributes the bit sequence having the second number of bits less than the first number of bits to the second error correction encoding unit 219 (second correcting unit, second corrector) with lower processing performance than the first error correction encoding unit 218 (encoder). The first error correction encoding unit 218 applies the error correction processing to the bit sequence having the first number of bits distributed to the first error correction encoding unit 218. The second error correction encoding unit 219 applies the error correction processing to the bit sequence having the second number of bits distributed to the second error correction encoding unit 219.

As a result, the error correction encoding unit 212a of the first embodiment can improve the efficiency of transmission without increasing the circuit size. The error correction encoding unit 212a of the first embodiment can perform the encoding processing according to processing performance for error correction for each correcting unit.

The error correction decoding unit 322a of the first embodiment (the signal processing device of the optical receiving device 3) includes the distributing unit 327 and the plurality of correcting units with different processing performance for error correction. The distributing unit 327 distributes the bit sequence having the first number of bits to the first error correction decoding unit 328 (first correcting unit). The distributing unit 327 distributes the bit sequence having the second number of bits less than the first number of bits to the second error correction decoding unit 329 (second correcting unit) with lower processing performance than the first error correction decoding unit 328.

The first error correction decoding unit 328 applies the error correction processing to the bit sequence having the first number of bits distributed to the first error correction decoding unit 328. The second error correction decoding unit 329 applies the error correction processing to the bit sequence having the second number of bits distributed to the second error correction decoding unit 329.

As a result, the error correction decoding unit 322a of the first embodiment can improve the efficiency of transmission without increasing the circuit size. The error correction decoding unit 322a of the first embodiment can perform the decoding processing according to the performance for error correction for each correcting unit.

Second Embodiment

The second embodiment differs from the first embodiment in that the signal processing device includes a control unit for controlling the operating frequency of each of correcting units. In the second embodiment, differences from the first embodiment will be described.

Figure 8:
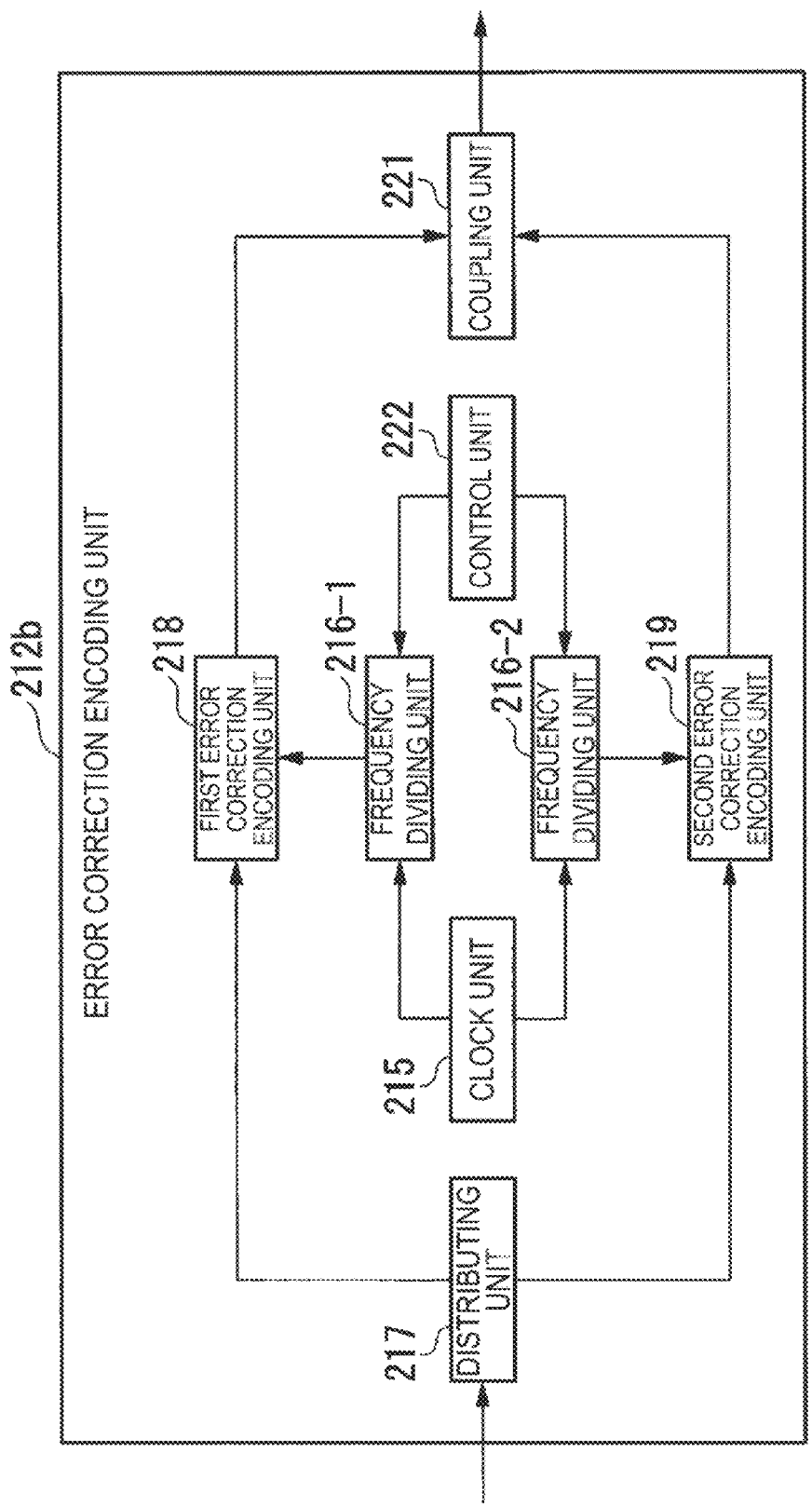
FIG. 8 is a diagram illustrating an exemplary configuration of an error correction encoding unit according to a second embodiment.

FIG. 8 is a diagram illustrating an exemplary configuration of the error correction encoding unit 212b. The error correction encoding unit 212b is provided in the optical transmitting device 2 in the identical manner as the error correction encoding unit 212a illustrated in FIG. 4.

The error correction encoding unit 212b includes a clock unit 215, a frequency dividing unit 216-1, a frequency dividing unit 216-2, a distributing unit 217, a first error correction encoding unit 218, a second error correction encoding unit 219, a coupling unit 221, and a control unit 222. The error correction encoding unit 212b may further include a frequency dividing unit 216, and a correcting unit such as the first error correction encoding unit 218.

The distributing unit 217 distributes a bit sequence having a large number of bits to the correcting unit with high performance for error correction. In FIG. 8, for example, the distributing unit 217 outputs, out of a 600 Gbps bit sequence output from the distributing unit 217, a 500 Gbps bit sequence to the first error correction encoding unit 218, and a remaining 100 Gbps bit sequence to the second error correction encoding unit 219.

The control unit 222 controls the operating frequency of each correcting unit according to the performance for error correction (coding gain) of each correcting unit such as the first error correction encoding unit 218. The control unit 222 adjusts the operating frequency of each correcting unit, thereby adjusting the number of bits in the bit sequence for which each correcting unit performs error correction.

For example, the control unit 222 sets the frequency division ratio in the case where the frequency dividing unit 216-1 divides the clock signal to the frequency dividing unit 216-1. The control unit 222 sets the frequency division ratio in the case where the frequency dividing unit 216-2 divides the clock signal to the frequency dividing unit 216-2. Here, the control unit 222 sets the operating frequency of the first error correction encoding unit 218 having high coding gain to be higher than the operating frequency of the second error correction encoding unit 219 having low coding gain. That is, the control unit 222 sets the frequency division ratio of the clock signal of the first error correction encoding unit 218 having high coding gain than the frequency division ratio of the clock signal of the second error correction encoding unit 219 having low coding gain.

Figure 9:
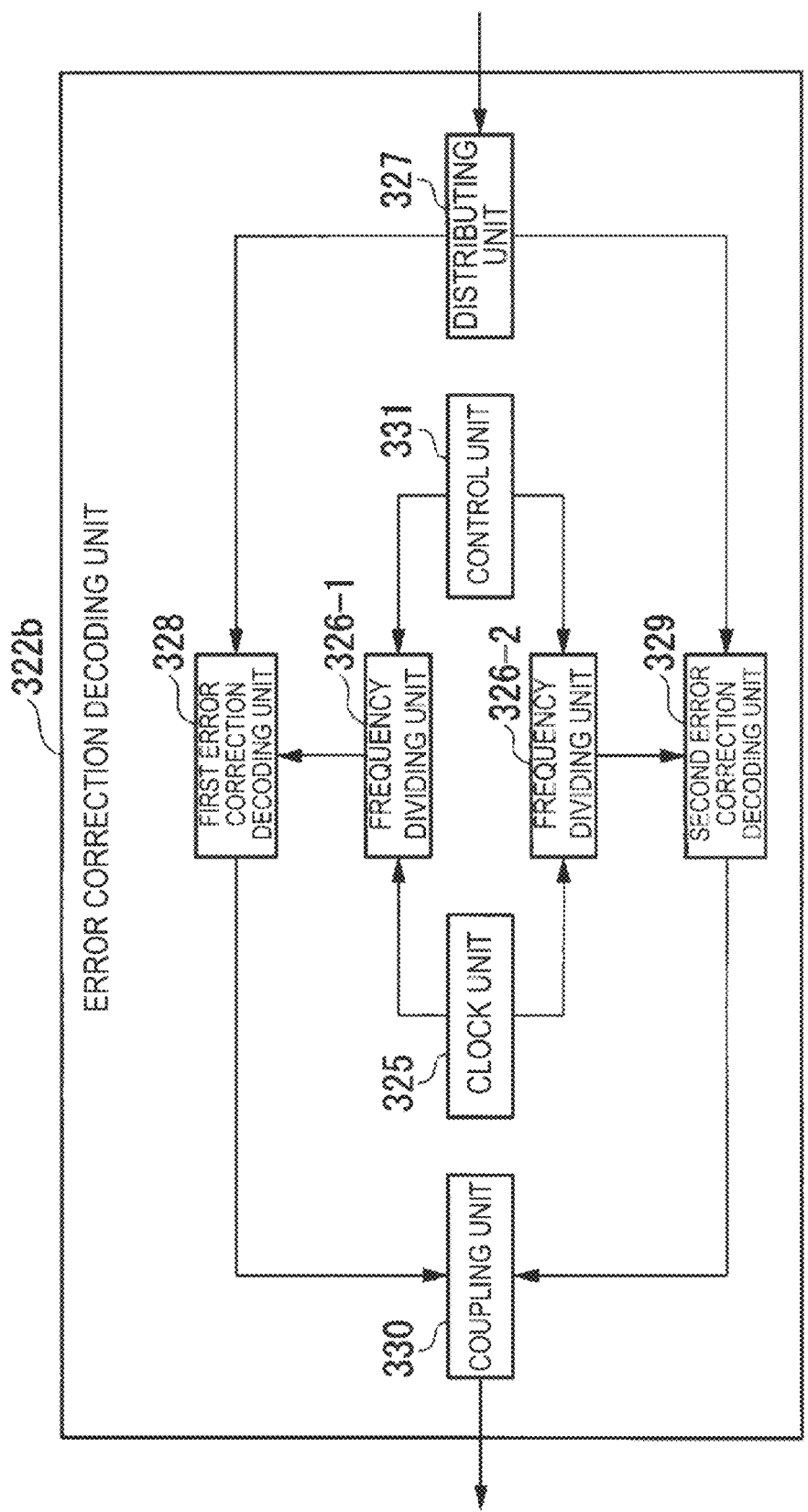
FIG. 9 is a diagram illustrating an exemplary configuration of an error correction decoding unit according to the second embodiment.

FIG. 9 is a diagram illustrating an exemplary configuration of the error correction decoding unit 322b. The error correction decoding unit 322b is provided in the optical transmitting device 2 in the identical manner as the error correction decoding unit 322a illustrated in FIG. 5. The error correction decoding unit 322b includes a clock unit 325, a frequency dividing unit 326-1, a frequency dividing unit 326-2, a distributing unit 327, a first error correction decoding unit 328, a second error correction decoding unit 329, a coupling unit 330, and a control unit 331. The error correction decoding unit 322b may further include a frequency dividing unit 326 and a correcting unit such as the first error correction decoding unit 328.

The distributing unit 327 distributes a bit sequence having a large number of bits to the correcting unit with high performance for error correction. In FIG. 9, for example, the distributing unit 327 outputs, out of a 600 Gbps bit sequence output from the distributing unit 327, a 500 Gbps bit sequence to the first error correction decoding unit 328, and a remaining 100 Gbps bit sequence to the second error correction decoding unit 329.

The control unit 331 controls the operating frequency of each correcting unit according to the performance for error correction (coding gain) of each correcting unit such as the first error correction decoding unit 328. The control unit 331 adjusts the operating frequency of each correcting unit, thereby adjusting the number of bits in the bit sequence for which each correcting unit performs error correction.

For example, the control unit 331 sets the frequency division ratio in the case where the frequency dividing unit 326-1 divides the clock signal to the frequency dividing unit 326-1. The control unit 331 sets the frequency division ratio in the case where the frequency dividing unit 326-2 divides the clock signal to the frequency dividing unit 326-2. Here, the control unit 331 sets the operating frequency of the first error correction decoding unit 328 having high coding gain to be higher than the operating frequency of the second error correction decoding unit 329 having low coding gain. That is, the control unit 331 sets the frequency division ratio of the clock signal of the first error correction decoding unit 328 having high coding gain to be smaller than the frequency division ratio of the clock signal of the second error correction decoding unit 329 having low coding gain.

As described above, the error correction encoding unit 212b (the signal processing device of the optical transmitting device 2) of the second embodiment further includes a control unit 222 (controller). The control unit 222 sets the operating frequency of the first error correction encoding unit 218 to be higher than the operating frequency of the second error correction encoding unit 219.

As a result, the error correction encoding unit 212b of the second embodiment can cause the correcting unit with high performance to correct an error in the bit sequence having a larger number of bits. The error correction encoding unit 212b of the second embodiment can further improve the efficiency of transmission without increasing the circuit size.

The error correction decoding unit 322b (the signal processing device of the optical receiving device 3) of the second embodiment further includes the control unit 331. The control unit 331 sets the operating frequency of the first error correction decoding unit 328 to be higher than the operating frequency of the second error correction decoding unit 329.

As a result, the error correction decoding unit 322b of the second embodiment can cause the correcting unit with high performance to correct an error in the bit sequence having a larger number of bits. The error correction decoding unit 322b of the second embodiment can further improve the efficiency of transmission without increasing the circuit size.

Third Embodiment

The third embodiment differs from the second embodiment in that a correcting unit with high performance for error correction performs error correction of bits with high error rate in multi-level Quadrature Amplitude Modulation (QAM) symbol code. In the third embodiment, differences from the second embodiment will be described.

In the first embodiment and the second embodiment, the correcting unit with high performance for error correction (correcting unit having high coding gain) applies the error correction processing to the bit sequence having a larger number of bits as compared to the bit sequence having a number of bits processed by the correcting unit with low performance for error correction.

In the third embodiment, the correcting unit with high performance for error correction performs error correction of the bit at the bit position with high error rate in the 16QAM symbol code. That is, the correcting unit with low performance for error correction performs error correction of the bit at the bit position with high error rate in the symbol code. Note that the third embodiment may be combined with the first embodiment and the second embodiment.

The distributing unit 217 distributes the encoded bit sequence to the first error correction encoding unit 218 and the second error correction encoding unit 219 according to the characteristic of the encoded bit sequence. The characteristic of the bit sequence is, for example, the characteristic of the error rate at the bit position of the bit sequence. That is, the characteristic of the bit sequence is, for example, the characteristic representing a relationship between the bit position in the symbol code and the error rate.

Figure 10:
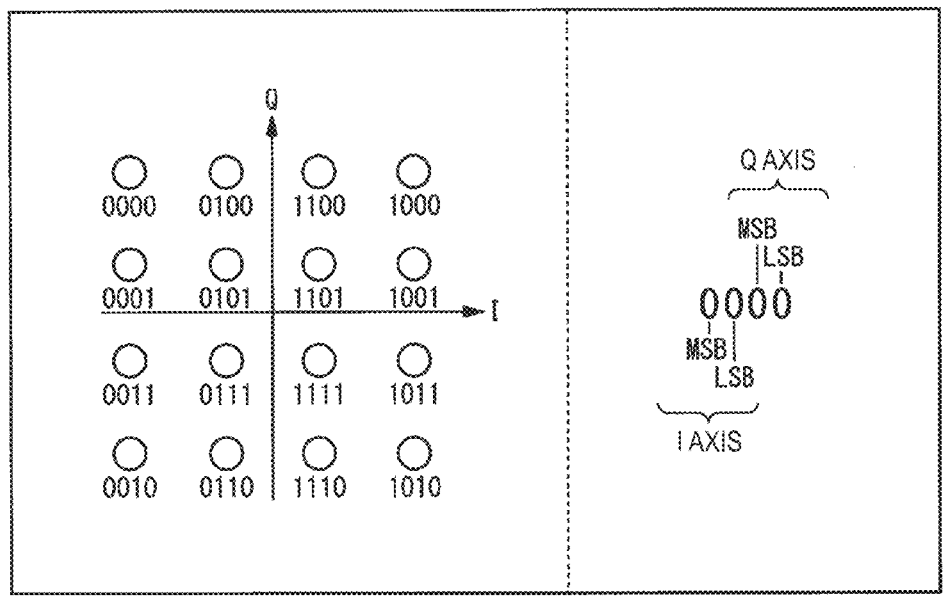
FIG. 10 is a diagram illustrating an example of 16QAM symbol mapping according to a third embodiment.

FIG. 10 is a diagram illustrating an example of 16 QAM symbol mapping (constellation map). The bit length of the 16 QAM symbol code is four bits. A bit group that affects the position on an I axis in the constellation map is two high-order bits in the symbol code. A bit group that affects the position on a Q axis in the constellation map is two low-order bits in the symbol code.

In 16 QAM, the error rate varies depending on the bit position in the symbol code. Thus, the distributing unit 217 can improve the transmission characteristic by distributing the bit at the bit position with high error rate to the correcting unit with high performance for error correction (high coding gain).

According to the value of the most significant bit (MSB) in two high-order bits in the symbol code, it is determined whether the position of the symbol has a positive value or a negative value on the I axis. Similarly, according to the value of the MSB in two low-order bits in the symbol code, it is determined whether the position of the symbol has a positive value or a negative value on the Q axis. In 16 QAM, the position of the symbol in the constellation map largely varies according to the value of the MSB in two high-order bits or two low-order bits in the symbol code. Thus, in 16 QAM, the MSB error rate is not high.

The symbols that differ only in the value of the least significant bit (LSB) of two high-order bits in the symbol code are adjacent to each other in the constellation map. Similarly, the symbols that differ only in the value of the LSB of two low-order bits in the symbol code are adjacent to each other in the constellation map. Thus, in 16 QAM, the positions of the symbols in the constellation map do not differ greatly according to the value of the LSB of two high-order or low-order bits in the symbol code. Thus, in 16 QAM, the error rate of the LBS is high.

The bit position in the symbol code allocated to each bit in the bit sequence output from the probabilistic shaping encoding unit 211 is known. The distributing unit 217 acquires information representing the bit position from the probabilistic shaping encoding unit 211. That is, the distributing unit 217 acquires information representing the MSB or LSB from the probabilistic shaping encoding unit 211.

When acquiring the information representing the LSB, the distributing unit 217 outputs bits in the bit sequence acquired from the probabilistic shaping encoding unit 211 to the first error correction encoding unit 218. When acquiring the information representing the MSB, the distributing unit 217 outputs bits in the bit sequence acquired from the probabilistic shaping encoding unit 211 to the second error correction encoding unit 219 having lower processing performance than the first error correction encoding unit 218.

The distributing unit 327 of the error correction decoding unit 322b operates similarly. The distributing unit 327 distributes the encoded bit sequence to the first error correction decoding unit 328 and the second error correction decoding unit 329 according to the characteristic of the encoded bit sequence. That is, when the value of the LSB in two high-order or low-order bits in the symbol code is acquired from the demodulating unit 321, the value is output to the first error correction decoding unit 328 with high performance for error correction. When acquiring the value of the MSB in two high-order or low-order bits in the symbol code from the demodulating unit 321, the distributing unit 217 outputs the value to the second error correction decoding unit 329 with low processing performance for error correction.

As described above, the error correction encoding unit (the signal processing device of the optical transmitting device 2) of the third embodiment further includes a probabilistic shaping encoding unit 211 (output unit, outputter). The probabilistic shaping encoding unit 211 (probabilistic shaping encoder) outputs a bit sequence encoded by 16 QAM probabilistic shaping or the like to the distributing unit 217. The distributing unit 217 distributes the encoded bit sequence to the plurality of correcting units (correctors) according to the characteristic of the error rate at the bit position of the encoded bit sequence.

Accordingly, the error correction encoding unit of the third embodiment can improve the efficiency of transmission of the optical signal in 16QAM multi-level modulation without increasing the circuit size.

The decoding correcting unit (signal processing device of the optical receiving device 3) of the third embodiment further includes a demodulating unit 321 (output unit). The demodulating unit 321 outputs a bit sequence encoded by the 16QAM probabilistic shaping or the like to the distributing unit 327. The distributing unit 327 distributes the encoded bit sequence to the first error correction decoding unit 328 and the second error correction decoding unit 329 according to the characteristic of the error rate at the bit position of the encoded bit sequence.

Accordingly, the decoding correcting unit of the third embodiment can improve the efficiency of transmission of the optical signal in 16 QAM multi-level modulation without increasing the circuit size.

Note that, when the positions of the symbol in the constellation map differ greatly according to the value of the LSB and the positions of the symbols in the constellation map do not vary greatly according to the value of the MSB, the error rate of the LBS is not higher than the error rate of the MBS. When the bit position and the error rate in the symbol code have such relationship, the distributing unit 217 conversely distributes the bit sequence. That is, when acquiring information representing the MSB, the distributing unit 217 outputs bits in the bit sequence acquired from the probabilistic shaping encoding unit 211 to the first error correction encoding unit 218 with high performance for error correction. When acquiring information representing the LSB, the distributing unit 217 acquires bits in the bit sequence acquired from the probabilistic shaping encoding unit 211 to output to the second error correction encoding unit 219 with low processing performance for error correction. The distributing unit 327 of the error correction decoding unit 322b operates similarly.

Fourth Embodiment

The fourth embodiment differs from the third embodiment in that a correcting unit with high performance for error correction performs error correction of bits with high error rate in multi-level quadrature amplitude modulation symbol code, which is not limited to 16 QAM. In the fourth embodiment, differences from the third embodiment will be described.

In the fourth embodiment, the correcting unit with high performance for error correction performs error correction of bits at the bit positions with high error rate in the quadrature amplitude modulation of the bit sequence of symbol code. That is, the correcting unit with low performance for error correction performs error correction of bits at the bit positions with low error rate in the symbol code. In the third embodiment, the optical transmitting device 2 performs multi-level quadrature amplitude modulation that is not limited to 16 QAM. Note that the fourth embodiment may be combined with the first embodiment and the second embodiment.

FIG. 9 is a diagram illustrating an example of 64 QAM symbol mapping (constellation map). The bit length of the 64 QAM symbol code is six bits. A bit group that affects the position on an I axis in the constellation map is three high-order bits in the symbol code. A bit group that affects the position on a Q axis in the constellation map is three low-order bits in the symbol code.

In the multi-level quadrature amplitude modulation, the error rate varies depending on the bit position in the symbol code. Thus, the distributing unit 217 can improve the transmission characteristic by distributing the bit at the bit position with high error rate to the correcting unit with high performance for error correction (high coding gain).

The bit length of the $N^2$ (N=4, 8, 16 . . . ) QAM symbol code can be expressed using logarithm and is ($2 \times \log_2 N$) bits. The bit group that affects the axial position in the constellation map is represented by a bit group consisting of ($\log_2 N$) bits for each axis. The bit positions in the bit group consisting of ($\log_2 N$) bits are expressed as the first bit, . . . ($\log_2 N$)th bit in the order from most significant bit to least significant bit.

For example, in the 64 ($=8^2$) QAM symbol code (bit length=6 bits), the bit group that affects the axial position in the constellation map is represented by a bit group consisting of 3 ($=\log_2 8$) bits for each axis. The bit positions in the bit group consisting of three bits are expressed as the first bit, the second bit, and the third bit in the order from most significant bit to least significant bit.

In the constellation map, the symbol code is allocated to be linearly symmetric about the I or Q axis according to the value of the first bit. That is, the symbols are collectively arranged on the positive or negative side on the I or Q axis according to the value of the first bit.

Figure 11:
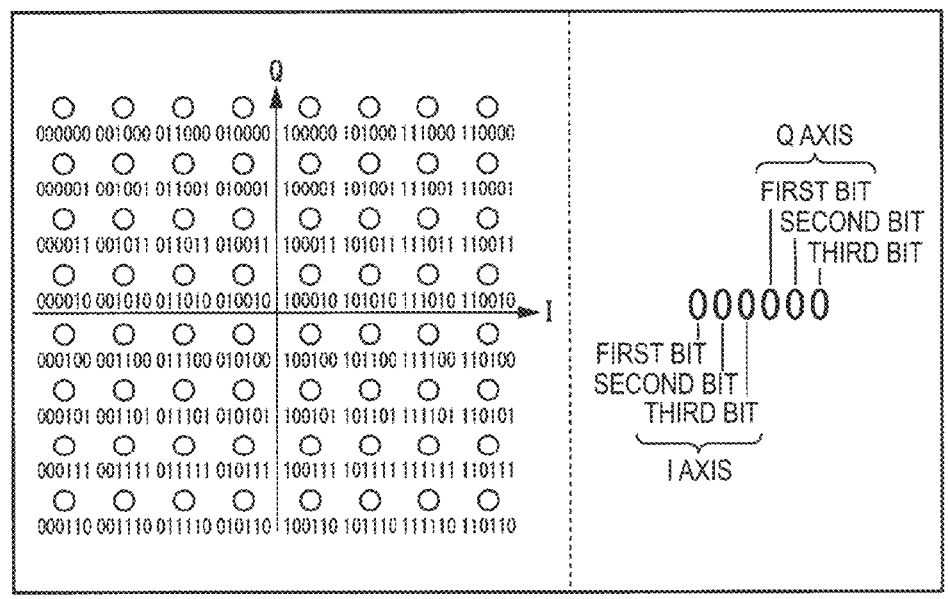
FIG. 11 is a diagram illustrating an example of 64QAM symbol mapping according to a fourth embodiment.
Figure 12:
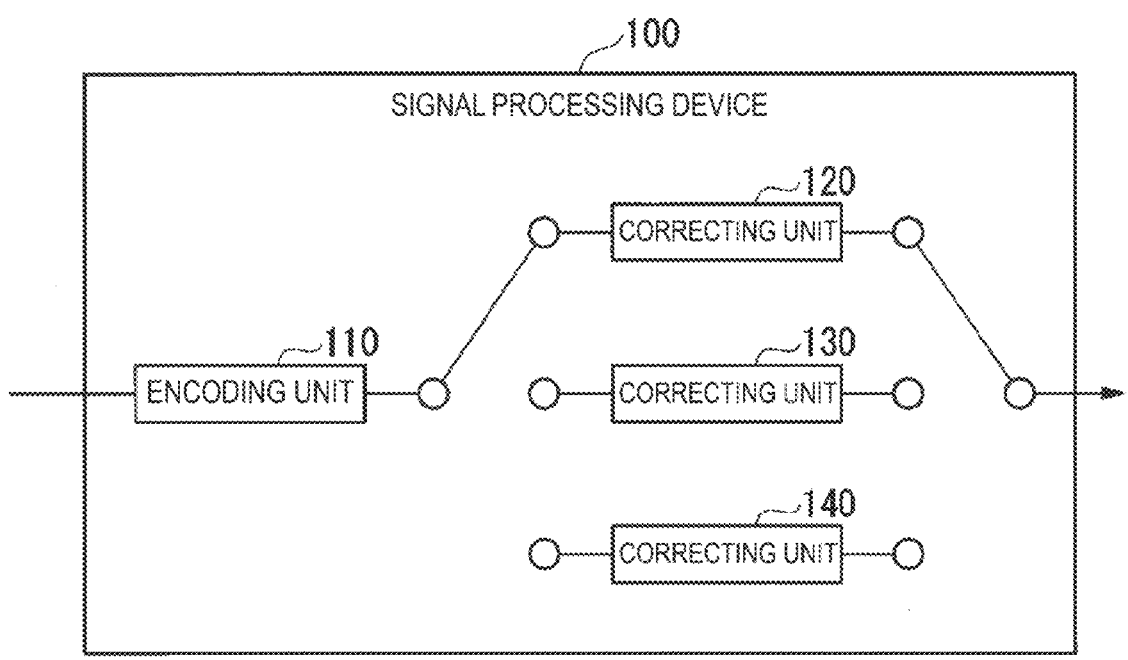
FIG. 12 is a diagram illustrating an exemplary configuration of a related art signal processing device.

For example, the symbols having the first bit that affects the position on the I axis of 0 are collectively arranged on the negative value side on the I axis. In FIG. 11, (0, 0, 0, 0, 1, 1, 1, 1) is allocated to the first bit that affects the position on the I axis from the negative to the positive value side on the I axis.

For example, the symbols having the first bit that affects the position on the Q axis of 0 are collectively arranged on the positive value side on the Q axis. In FIG. 11, (1, 1, 1, 1, 0, 0, 0, 0) is allocated to the first bit that affects the position on the Q axis from the negative to the positive value side on the Q axis.

In this manner, in the constellation map, the group of the first bit of 1 is collectively arranged on the positive or negative value side on the axis without being divided into the positive and negative value sides. Similarly, the group of the first bit of 0 is collectively arranged on the positive or negative value side on the axis without being divided into the positive and negative value sides.

In FIG. 11, (0, 0, 1, 1, 0, 0, 1, 1) is allocated to the second bit that affects the position on the I axis from the negative to the positive value side on the I axis. (1, 1, 0, 0, 1, 1, 0, 0) is allocated to the second bit that affects the position on the Q axis from the negative to the positive value side on the Q axis.

In this manner, in the constellation map, the group of the second bit of 1 is divided into the positive and negative value sides on the axis. Similarly, the group of the second bit of 0 is divided into the positive and negative value sides on the axis.

In FIG. 11, (0, 1, 1, 0, 0, 1, 1, 0) is allocated to the third bit that affects the position on the I axis from the negative to the positive value side on the I axis. (0, 1, 1, 0, 0, 1, 1, 0) is allocated to the third bit that affects the position on the Q axis from the negative to the positive value side on the Q axis.

According to the value of the first bit in the high-order bit group in the symbol code, it is determined whether the symbol position has a positive value or a negative value on the I axis. Similarly, according to the value of the first bit in the low-order bit group in the symbol code, it is determined whether the symbol position has a positive value or a negative value on the Q axis. In this way, in the multi-level quadrature amplitude modulation, as the bit in the high-order or low-order bit group is higher in the symbol code, the position of the symbol varies more largely in the constellation map according to the value of the bit. Thus, in the multi-level quadrature amplitude modulation, the error rate of the first bit is not high in the high-order or low-order bit group in the symbol code.

The symbols that differ only in the value of the third bit in the high-order bit group in the symbol code are adjacent to each other in the constellation map. Similarly, the symbols that differ only in the value of the third bit in the low-order bit group in the symbol code are adjacent to each other in the constellation map. In this way, in the multi-level quadrature amplitude modulation, as the bit in the high-order or low-order bit group in the symbol code is lower, the position of the symbol varies more largely in the constellation map according to the value of the bit. Thus, in the multi-level quadrature amplitude modulation, the error rate of the third bit in the high-order or low-order bit group in the symbol code is high.

The bit position in the symbol code allocated to each bit in the bit sequence output from the probabilistic shaping encoding unit 211 is known. The distributing unit 217 acquires information representing the bit position from the probabilistic shaping encoding unit 211. That is, the distributing unit 217 acquires information representing the bit position of the symbol code from the probabilistic shaping encoding unit 211.

In FIG. 11, when acquiring information representing the low-order bit such as $(\log_2 N)$th bit, since the error rate of the low-order bit is high, the distributing unit 217 outputs the bits in the bit sequence acquired from the probabilistic shaping encoding unit 211 to the first error correction encoding unit 218 with high performance for error correction. When acquiring information representing intermediate bits from the second bit to the $((\log_2 N)-1)$th bit, the distributing unit 217 outputs the bits in the bit sequence acquired from the probabilistic shaping encoding unit 211 to the first error correction encoding unit 218 or the second error correction encoding unit 219. Outputting to either the first error correction encoding unit 218 or the second error correction encoding unit 219 is predetermined for each bit position, for example. When acquiring information representing the high-order bit such as the first bit, since the error rate of the low-order bit is high, the distributing unit 217 outputs the bits in the bit sequence acquired from the probabilistic shaping encoding unit 211 to the second error correction encoding unit 219 with low performance for error correction.

As described above, the error correction encoding unit (the signal processing device of the optical transmitting device 2) of the fourth embodiment further includes a probabilistic shaping encoding unit 211 (output unit, outputter). The probabilistic shaping encoding unit 211 outputs a bit sequence encoded by a probabilistic shaping or the like to the distributing unit 217. The distributing unit 217 distributes the encoded bit sequence to the plurality of correcting units according to the characteristic of the error rate at the bit position of the encoded bit sequence.

Accordingly, the error correction encoding unit of the fourth embodiment can improve the efficiency of transmission of the optical signal in the multi-level modulation without increasing the circuit size.

The decoding correcting unit (the signal processing device of the optical receiving device 3) according to output to the fourth embodiment further includes a demodulating unit 321 (output unit). The demodulating unit 321 outputs a bit sequence encoded by the 16QAM probabilistic shaping or the like to the distributing unit 327. The distributing unit 327 distributes the encoded bit sequence to the first error correction decoding unit 328 and the second error correction decoding unit 329 according to the characteristic of the error rate at the bit position of the encoded bit sequence.

Accordingly, the decoding correcting unit of the fourth embodiment can improve the efficiency of transmission of the optical signal in multi-level modulation without increasing the circuit size.

Note that, when the positions of the symbols in the constellation map differ greatly according to the value of the low-order bit and the positions of the symbols in the constellation map do not vary greatly according to the value of the high-order bit, the error rate of the low-order bit is not higher than the error rate of the high-order bit. When the bit position and the error rate in the symbol code have such relationship, the distributing unit 217 conversely distributes the bit sequence. That is, when acquiring information representing the high-order bit, the distributing unit 217 outputs bits in the bit sequence acquired from the probabilistic shaping encoding unit 211 to the first error correction encoding unit 218 with high performance for error correction. When acquiring information representing intermediate bits between the high-order bit and the low-order bit, the distributing unit 217 outputs the bits in the bit sequence acquired from the probabilistic shaping encoding unit 211 to the first error correction encoding unit 218 or the second error correction encoding unit 219. When acquiring information representing the low-order bit, the distributing unit 217 acquires bits in the bit sequence acquired from the probabilistic shaping encoding unit 211 to output to the second error correction encoding unit 219 with low processing performance for error correction. The distributing unit 327 of the error correction decoding unit 322b operates similarly.

The embodiments of the present invention have been described above in detail with reference to the drawings. However, specific configurations are not limited to those embodiments, and include any design or the like within the scope not departing from the gist of the present invention.

REFERENCE SIGNS LIST

1 Communication system
2 Optical transmitting device
3 Optical receiving device
4 Optical fiber
5 Amplifying unit
20 Transmitting device interface
21 Transmission processing unit 22 Driver
23 Optical transmitter
30 Optical receiver
31 Amplifier
32 Reception processing unit
33 Receiving device interface
100 Signal processing device
110 Encoding unit
120 Correcting unit
130 Correcting unit
140 Correcting unit
210 Framer
211 Probabilistic shaping encoding unit
212a, 212b Error correction encoding unit
213 Modulating unit
214 Digital-to-analog converting unit
215 Clock unit
216 Frequency dividing unit
217 Distributing unit
218 First error correction encoding unit
219 Second error correction encoding unit
220 Modulator driver
221 Coupling unit
230 Signal light source
231 Polarization modulator
232 Polarization beam combiner
300 Local light source
301 90-degree optical hybrid
302 Balanced optical detector
303 Polarizating beam splitter
310 Trans-impedance amplifier
320 Analog-to-digital converting unit
321 Demodulating unit
322a, 322b Error correction decoding unit
323 Probabilistic shaping decoding unit
324 Framer
325 Clock unit
326 Frequency dividing unit
327 Distributing unit
328 First error correction decoding unit
329 Second error correction decoding unit
330 Coupling unit

The invention claimed is:

1. A signal processing device comprising: a distributor; a controller; first and second correctors with different processing performance; a coupling unit and an outputter, wherein
the distributor is configured to distribute a bit sequence having a first number of bits to first corrector, and a bit sequence having a second number of bits less than the first number of bits to second corrector having lower processing performance than the first corrector,
the controller is configured to adjust a frequency division ratio of a clock signal to set an operating frequency of the first corrector to be higher than an operating frequency of the second corrector,
the first corrector is configured to apply error correction processing to the bit sequence having the first number of bits distributed to the first corrector,
the second corrector is configured to apply error correction processing to the bit sequence having the second number of bits distributed to the second corrector, and
the outputter is configured to output an encoded bit sequence to the distributor,
wherein the processing performance of the second corrector is set to be lower than that of the first corrector in advance by internal processing of the second corrector,
wherein the coupling unit couples the bit sequence of the first number of bits subjected to the error correction processing of the first corrector with the bit sequence of the second number of bits subjected to the error correction processing of the second corrector,
wherein the distributor distributes the encoded bit sequence to the first and second correctors according to a characteristic of error rate at each bit position of the encoded bit sequence.

2. A signal processing method implemented by a signal processing device including a distributor, a controller, first and second correctors with different processing performance, a coupling unit, and an outputter, the method including:
distributing a bit sequence having a first number of bits to first connector, and a bit sequence having a second number of bits less than the first number of bits to second corrector having lower processing performance than the first corrector,
adjusting a frequency division ratio of a clock signal to perform control to set an operating frequency of the first corrector to be higher than an operating frequency of the second corrector,
applying error correction processing to the bit sequence having the first number of bits distributed to the first corrector,
applying error correction processing to the bit sequence having the second number of bits distributed to the second corrector, and
outputting an encoded bit sequence to the distributor,
wherein the processing performance of the second corrector is set to be lower than that of the first corrector in advance by internal processing of the second corrector,
wherein the coupling unit couples the bit sequence of the first number of bits subjected to the error correction processing of the first corrector with the bit sequence of the second number of bits subjected to the error correction processing of the second corrector,
wherein the distributor distributes the encoded bit sequence to the first and second correctors according to a characteristic of error rate at each bit position of the encoded bit sequence.

\* \* \* \* \*